(12) United States Patent
Huang

(10) Patent No.: US 12,302,510 B2
(45) Date of Patent: May 13, 2025

(54) SUPPORT PLATE AND FOLDABLE DISPLAY SCREEN

(71) Applicant: Wuhan China Star Optoelectronics Semiconductor Display Technology Co., Ltd., Hubei (CN)

(72) Inventor: Yutian Huang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/297,656

(22) PCT Filed: Apr. 28, 2021

(86) PCT No.: PCT/CN2021/090493
§ 371 (c)(1),
(2) Date: Oct. 20, 2022

(87) PCT Pub. No.: WO2022/217655
PCT Pub. Date: Oct. 20, 2022

(65) Prior Publication Data
US 2024/0015902 A1    Jan. 11, 2024

(30) Foreign Application Priority Data
Apr. 15, 2021 (CN) .......................... 202110403592.1

(51) Int. Cl.
H05K 5/02 (2006.01)
(52) U.S. Cl.
CPC ..................................... H05K 5/02 (2013.01)
(58) Field of Classification Search
None
See application file for complete search history.

(56) References Cited

U.S. PATENT DOCUMENTS

2018/0097197 A1   4/2018  Han
2019/0373743 A1   12/2019 Liu
(Continued)

FOREIGN PATENT DOCUMENTS

| CN | 107863357 | 3/2018 |
|----|-----------|--------|
| CN | 110518039 | 11/2019 |

(Continued)

OTHER PUBLICATIONS

International Search Report and the Written Opinion Dated Dec. 27, 2021 From the International Searching Authority Re. Application No. PCT/CN2021/090493 and Its Translation Into English. (18 Pages).

(Continued)

*Primary Examiner* — Xanthia C Relford
*Assistant Examiner* — Xanthia C Cunningham

(57) ABSTRACT

A support plate and a foldable display screen are provided. The support plate includes at least one bending region, at least one rolling region, and non-bending regions. The at least one rolling region is close to an edge of the support plate. The at least one rolling region is used for sliding and rolling. The non-bending regions are arranged at two opposite sides of each of the at least one bending region and between the at least one bending region and the at least one rolling region. Each bending region and each rolling region both include first openings arranged in an array to reduce wrinkles and creases generated by a bending portion of the flexible display panel.

18 Claims, 7 Drawing Sheets

(56) References Cited

U.S. PATENT DOCUMENTS

| | | | |
|---|---|---|---|
| 2020/0253069 A1* | 8/2020 | Cha | G06F 1/1681 |
| 2021/0165454 A1 | 6/2021 | Dong et al. | |
| 2023/0034440 A1 | 2/2023 | Xie et al. | |
| 2023/0095528 A1* | 3/2023 | Park | G09G 3/035 |
| | | | 345/156 |

FOREIGN PATENT DOCUMENTS

| | | |
|---|---|---|
| CN | 110689813 | 1/2020 |
| CN | 110992828 | 4/2020 |
| CN | 111261049 | 6/2020 |
| CN | 111722674 | 9/2020 |
| CN | 111739421 | 10/2020 |
| CN | 211928943 | 11/2020 |
| CN | 112150925 | 12/2020 |
| CN | 112164311 | 1/2021 |
| CN | 112164312 | 1/2021 |
| CN | 112164317 | 1/2021 |
| CN | 112614433 | 4/2021 |
| KR | 10-2016-0029543 | 3/2016 |
| KR | 10-2016-0144912 | 12/2016 |
| KR | 2019-0001864 | 1/2019 |
| KR | 10-2020-0095307 | 8/2020 |

OTHER PUBLICATIONS

Notice of Reasons for Refusal Dated Jun. 13, 2023 From the Japan Patent Office Re. Application No. 2021-548166 and Its Translation Into English. (11 Pages).

Notification of Decision of Rejection Dated Sep. 5, 2022 From the State Intellectual Property Office of the People's Republic of China Re. Application No. 202110403592.1 and Its Translation Into English. (15 Pages).

Notification of Office Action and Search Report Dated Nov. 1, 2021 From the State Intellectual Property Office of the People's Republic of China Re. Application No. 202110403592.1 and Its Translation Into English. (20 Pages).

Notification of Office Action Dated Jun. 2, 2022 From the State Intellectual Property Office of the People's Republic of China Re. Application No. 202110403592.1 and Its Translation Into English. (12 Pages).

Notification on the Need to Submit Additional Materials Dated Jun. 7, 2023 From the Eurasian Patent Organization, EAPO, The Eurasian Patent Office Re. Application No. 202290360 and Its Translation Into English. (7 Pages).

Notification on the Need to Submit Additional Materials Dated Feb. 9, 2023 From the Eurasian Patent Organization, EAPO, The Eurasian Patent Office Re. Application No. 202290360 and Its Translation Into English. (4 Pages).

Request for the Submission of an Opinion Dated Oct. 24, 2022 From the Korean Intellectual Property Officce Re. Application No. 10-2021-7022209 and Its Translation Into English. (10 Pages).

Request for the Submission of an Opinion Dated Apr. 26, 2023 From the Korean Intellectual Property Officce Re. Application No. 10-2021-7022209 and Its Translation Into English. (14 Pages).

Supplementary European Search Report and the European Search Opinion Dated Jan. 29, 2025 From the European Patent Office Re. Application No. 21899303.8. (9 Pages).

* cited by examiner

SUPPORT PLATE AND FOLDABLE DISPLAY SCREEN

RELATED APPLICATIONS

This application is a National Phase of PCT Patent Application No. PCT/CN2021/090493 having International filing date of Apr. 28, 2021, which claims the benefit of priority of Chinese Patent Application No. 202110403592.1 filed on Apr. 15, 2021. The contents of the above applications are all incorporated by reference as if fully set forth herein in their entirety.

FIELD AND BACKGROUND OF THE INVENTION

The present invention relates to a field of display technology, and in particular, to a support plate and a foldable display screen.

Stacked structures of conventional foldable display screens usually comprise support plates for supporting flexible display panels. In order to make foldable display screens have better display effects with improved durability against bending, a portion of the support plate located in a bending region is removed. However, such a design causes a lack of effective support in the bending region of the foldable display screen, resulting in more severe wrinkles (waviness) and creases in the bending region due to repeated folding or unfolding.

Therefore, there is an urgent need to improve structures of the conventional foldable display screens.

SUMMARY OF THE INVENTION

The present invention provides a support plate and a foldable display screen, so as to solve a technical problem that conventional foldable display screens lack effective support in a bending region, which causes more severe wrinkles and creases in the bending region after repeated folding or unfolding.

To solve the above-mentioned problem, the present invention provides following solutions:

The present invention provides a support plate for supporting a flexible display panel, comprising: at least one bending region configured to bend; at least one rolling region arranged close to an edge of the support plate, the at least one rolling region configured to slide and roll; and a plurality of non-bending regions arranged at two opposite sides of each of the at least one bending region and between the at least one bending region and the at least one rolling region; wherein any one of the at least one bending region and any one of the at least one rolling region both comprise a plurality of first openings arranged in an array.

According to at least one embodiment of the present invention, any one of the first openings comprises two first sub-openings extending along a first direction and defined in a direction perpendicular to the first direction, and a second sub-opening defined between the two first sub-openings and extending along a second direction; and the second direction is different from the first direction.

According to at least one embodiment of the present invention, the first openings in any two adjacent columns or in any two adjacent rows are defined staggered with respect to each other.

According to at least one embodiment of the present invention, the first direction and the second direction are perpendicular to each other, and the two first sub-openings of any one of the first openings are arranged parallel and flush with each other.

According to at least one embodiment of the present invention, a maximum length of each of the first openings along the first direction is L, a spacing between center lines, along the second direction, of the second sub-openings of the first openings in two adjacent columns is S, and $L/2 < S < L$.

According to at least one embodiment of the present invention, a maximum length of each of the first openings in the second direction is W, a maximum width of each of the first sub-openings in the second direction is W1, a spacing between center lines, in the first direction, of the second sub-openings of the first openings in two adjacent rows is D, and $W1 < D < (W - 2W1)$.

According to at least one embodiment of the present invention, the support plate further comprises a plurality of second openings, the second openings extend along the second direction, and the second openings and the first openings are alternately defined in the second direction.

According to at least one embodiment of the present invention, a center line, along the second direction, of any one of the second openings coincides with a center line, along the second direction, of each of the second sub-openings of the first openings in the same column.

According to at least one embodiment of the present invention, the first sub-openings in any two adjacent rows are defined staggered with respect to each other, the first sub-openings in odd-numbered rows are aligned with each other, and the first sub-openings in even-numbered rows are aligned with each other.

According to at least one embodiment of the present invention, the second sub-openings of any two columns among the second sub-openings of four consecutive columns are staggered with respect to each other.

According to at least one embodiment of the present invention, in a same first opening, the second sub-opening communicates with the two first sub-openings.

According to at least one embodiment of the present invention, in a same first opening, there is a gap between the second sub-opening and each of the two first sub-openings.

According to at least one embodiment of the present invention, a length of each of the first sub-openings is greater than a length of each of the second sub-openings.

According to at least one embodiment of the present invention, each of the at least one bending region and each of the at least one rolling region both comprise a middle area and edge areas arranged at two sides of the middle area and adjacent to free edges, and a plurality of third openings extending from the free edges to the middle area are defined in the edge areas.

According to at least one embodiment of the present invention, the third openings extend along the first direction, the third openings are defined in the direction perpendicular to the first direction, and any one of the third openings is defined in a same row with at least one of the first sub-openings.

According to at least one embodiment of the present invention, the third openings comprise a plurality of third sub-openings and a plurality of fourth sub-openings with different lengths, and the third sub-openings and the fourth sub-openings are alternately defined.

According to at least one embodiment of the present invention, each of the third openings has a U shape.

According to at least one embodiment of the present invention, each of the at least one bending region is bent along a bending axis, and a sliding direction of the rolling region is perpendicular to the bending axis of each of the at least one bending region.

According to at least one embodiment of the present invention, an extending direction of each of the first sub-openings is the same as a direction of the bending axis of each of the at least one bending region, and an extending direction of each of the second sub-openings is the same as the sliding direction of each of the at least one rolling region.

According to at least one embodiment of the present invention, the support plate comprises a first non-bending region, one bending region, a second non-bending region, and one rolling region that are sequentially arranged, and a bending direction of the bending region is opposite to a rolling direction of the rolling region.

The present invention further provides a foldable display screen, comprising the support plate in any one of the above embodiments and a flexible display panel arranged on one side of the support plate, wherein the flexible display panel comprises at least one bending portion arranged corresponding to the at least one bending region of the support plate, at least one rolling portion arranged corresponding to the at least one rolling region of the support plate, and a plurality of plane portions arranged corresponding to the non-bending regions of the support plate.

According to at least one embodiment of the present invention, the foldable display screen further comprises: a backplate arranged between the flexible display panel and the support plate; a polarizer arranged on one side of the flexible display panel away from the support plate; and a touch layer arranged on one side of the polarizer away from the flexible display panel.

Advantages of the Present Invention

In the present invention, the support plate is a structure with the bending region and the rolling region, and the first openings arranged in an array are defined in both the bending region and the rolling region. Therefore, the present invention can support a flexible display panel and improve flatness of the flexible display panel, can also make the support plate in the bending region have good extension performance and ability to recover from deformations, and can relieve a problem of wrinkles and creases generated in a bending portion of a conventional flexible display panel.

BRIEF DESCRIPTION OF THE SEVERAL VIEWS OF THE DRAWINGS

The present application is described in detail below in conjunction with the accompanying drawings for ease of understanding the technical solutions and other beneficial effects of the present application.

DESCRIPTION OF SPECIFIC EMBODIMENTS OF THE INVENTION

The present application provides a support plate and a foldable display screen. In order to make the purpose, technical solution, and effects of the present application clearer and more specific, a detailed description of the present application is provided below with reference to the accompanying drawings and embodiments. It should be noted that the specific embodiments described here are only used to explain the present application, and are not used to limit the present application.

The present invention is directed to solving a problem of conventional foldable display screens, that is, a bending region of a foldable display screen lacks effective support because a portion of a support plate located in the bending region is removed, which results in more severe wrinkles and creases in the bending region after repeated folding or unfolding.

Figure 1:
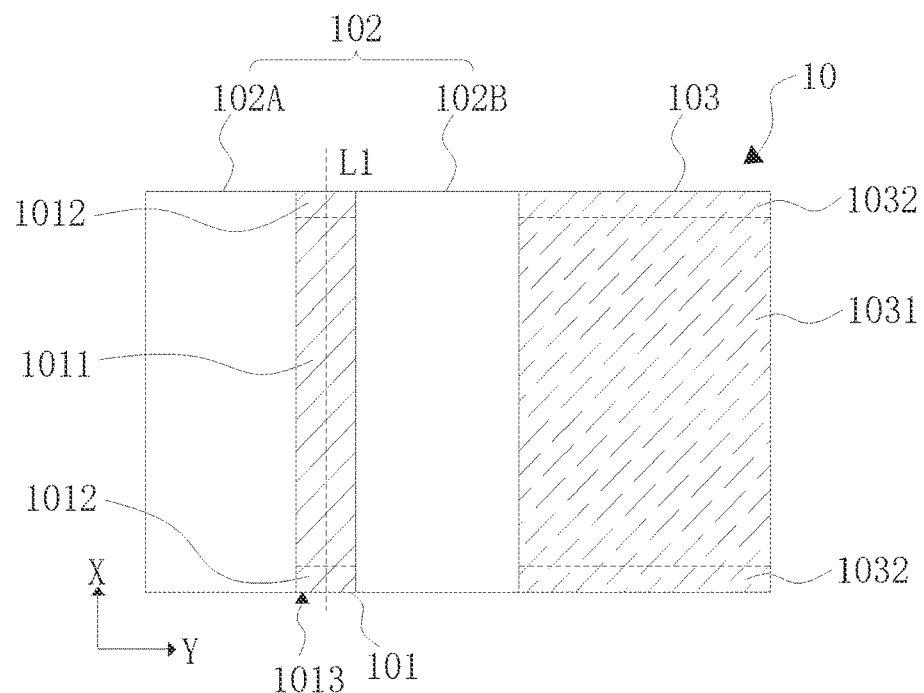
FIG. 1 is a schematic plan view illustrating a support plate according to one embodiment of the present invention.
Figure 2:
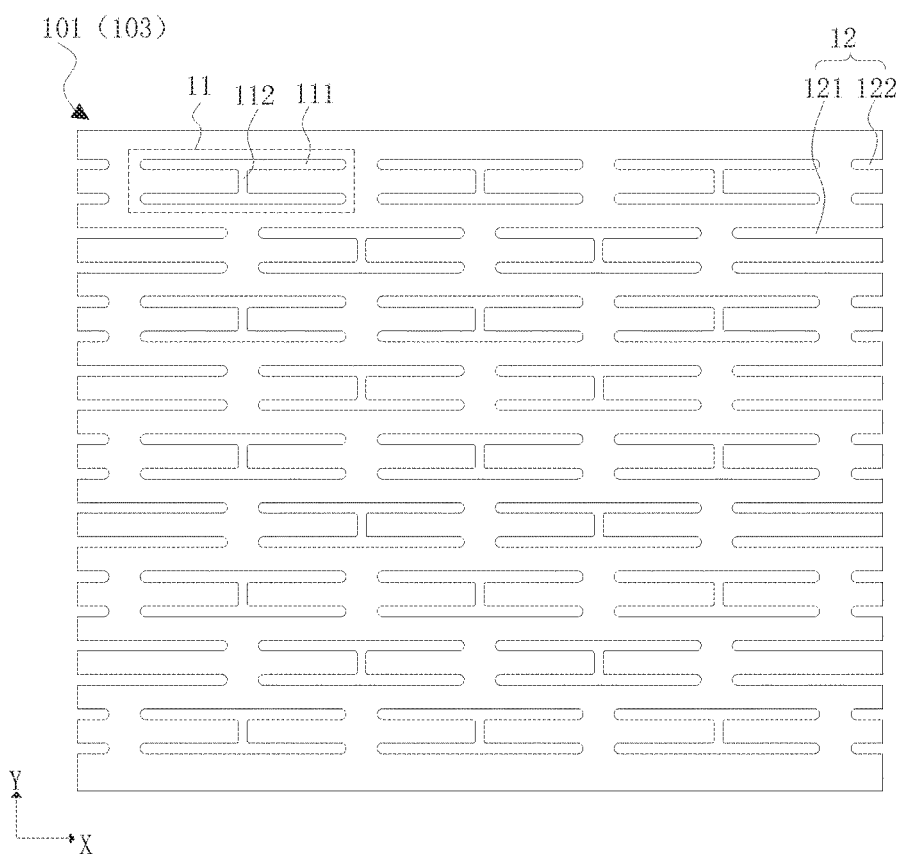
FIG. 2 is a schematic structural view illustrating a bending region of the support plate according to one embodiment of the present invention.

Referring to FIGS. 1 and 2, a support plate 10 is provided according to one embodiment of the present invention. The support plate 10 is configured to support a flexible display panel. The support plate 10 comprises at least one bending region 101, at least one rolling region 103, and a plurality of non-bending regions 102. The at least one bending region 101 is configured to bend, the at least one rolling region 103 is arranged close to an edge of the support plate 10, and the at least one rolling region 103 is configured to slide and roll. The non-bending regions 102 are arranged at opposite sides of each of the at least one bending region 101 and between the at least one bending region 101 and the at least one rolling region 103. The at least one bending region 101 and the at least one rolling region 103 all comprise a plurality of first openings 11 arranged in an array.

Conventional foldable display products have a double-folding design, that is, outward folding plus inward folding. An outward folding region and an inward folding region of a support plate are hollowed out, so the support plate becomes three independent support plates. Although the foldable display products with such structures have good display effects and longer durability against bending, due to a lack of support in the outward and inward folding regions, more severe wrinkles and creases are generated in the inward and outward folding regions if a screen is repeatedly folded for a long time. Compared with the conventional support plate with a three-section design, a support plate of the present invention adopts a new bendable plus rollable design, and keeps portions of the support plate in its bending region and rolling region. By digging holes in the bending region and the rolling region, the present application not only relieves a wrinkle problem in the bending region, but also realizes a new foldable display design with a slidable and rollable feature.

Specifically, any one of the first openings 11 comprises two first sub-openings 111 extending along a first direction X and distributed along a direction perpendicular to the first direction X, and a second sub-opening 112 arranged between the two first sub-openings 111 and extending along a second direction Y. The second direction Y is different from the first direction X. The first openings 11 of the support plate 10 of the present embodiment comprises the first sub-openings 111 and the second sub-openings 112 extending in different directions, so different stresses in a bending region and a rolling region can be released at the same time.

A material of the support plate 10 comprises, but is not limited to, stainless steel (SUS).

The support plate 10 of the present invention can support and protect the bending region of the flexible display panel. Compared with conventional techniques that only have first sub-openings, the support plate 10 comprises the first sub-openings 111 and the second sub-openings 112 in the bending region 101 and the rollable region 103. On one hand, opening area ratios of the bending region 101 and the rollable region 103 are increased, which is beneficial to reduce Young's modulus in the bending region 101 and the rolling region 103 of the support plate 10, and improves elastic deformation of the support plate 10. This is also conducive to realizing a new rollable type foldable display and prolonging durability of the support plate 10 against bending under a condition of a very small bending radius, while reducing wrinkles and creases in the bending region 101.

Figure 3:
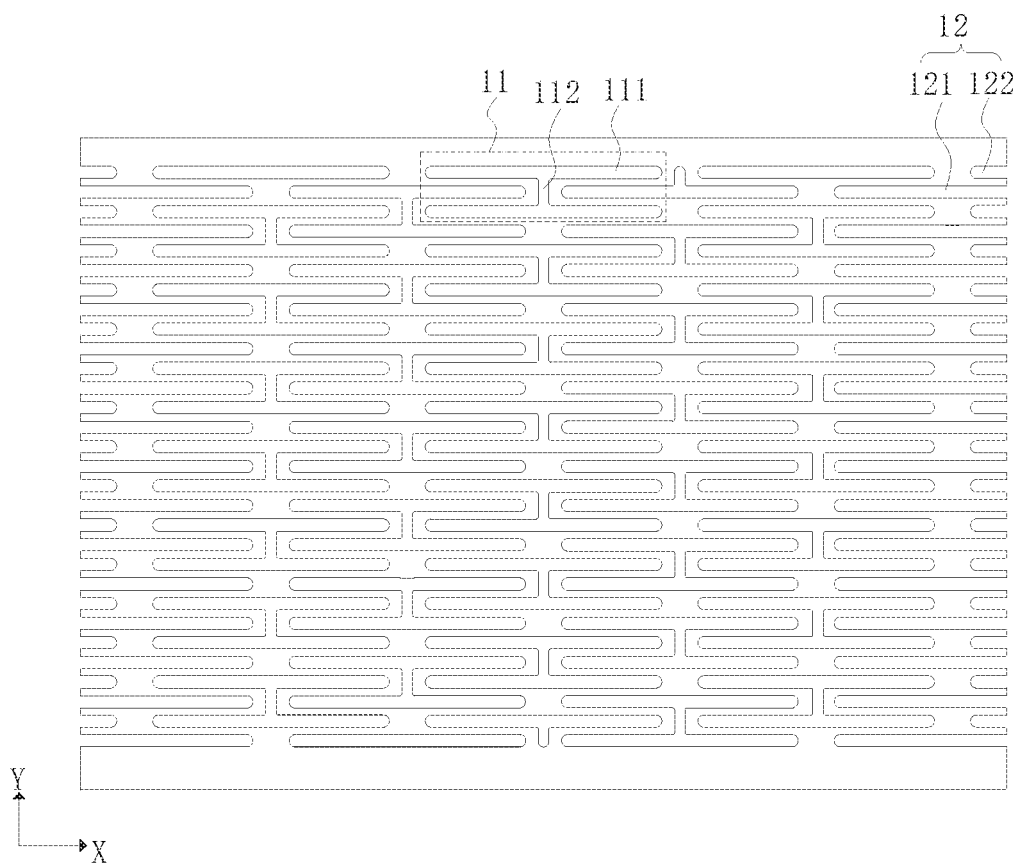
FIG. 3 is a schematic structural view illustrating the bending region of the support plate according to another embodiment of the present invention.

Referring to FIGS. 2 and 3, in one embodiment, the first openings 11 in any two adjacent columns or any two adjacent rows are arranged in a staggered manner. The staggered first openings 11 are under an influence of a material strength of their adjacent non-opening portions. Therefore, after a bending force disappears, a stretched portion of the first opening 11 can quickly return to its original shape, so that the support plate 10 has a good ability to recover from deformations, thereby reducing wrinkles and creases of the flexible display panel due to repeated folding and unfolding, and ensuring flatness of the flexible display panel after it is restored to a flat state. The staggered arrangement of the first openings 11 can allow a more uniform distribution of stress received by the support plate 10 during bending, and prevent the stress from being concentrated in a certain place.

The bending region 101 is bent along a bending axis L1, and a sliding direction of the rolling region 103 is perpendicular to the bending axis L1. Furthermore, a rolling axis of the rolling region 103 is parallel to the bending axis L1.

An extending direction of the first sub-openings 111 is the same as a direction of the bending axis L1, which is beneficial to a release of a bending stress when the bending region 101 is bent, and when the rolling region 103 is rolled.

An extending direction of the second sub-opening 112 is the same as the sliding direction of the rolling region 103, which is beneficial to a release of a tensile stress that the rolling region 103 receives during sliding.

In some embodiments of the present invention, the first sub-openings 111 in any two adjacent rows are distributed in a staggered manner, the first sub-openings 111 in odd-numbered rows are aligned with each other, and the first sub-openings 111 in even-numbered rows are aligned with each other.

Furthermore, in one embodiment, referring to FIG. 3, the first openings 11 of any two columns among the first openings 11 of four consecutive columns are arranged in a staggered manner, so that distribution of stress is more uniform.

To be specific, the second sub-openings 112 of any two columns among the second sub-openings 112 of four consecutive columns are arranged in a staggered manner.

In the present embodiment, the first direction X and the second direction Y are perpendicular to each other, and the two first sub-openings 111 of any one of the first openings 11 are parallel and flush with each other. As shown in FIG. 2, in any of the first openings 11, outer end points of the two first sub-openings 111 on a same side are connected by a line in a direction the same as the first direction X.

Furthermore, a center line of the second sub-opening 112 of any first opening 11 in the second direction Y coincides with a center line of the first sub-opening 111 of each of the first openings 11 in the second direction Y.

Figure 4:
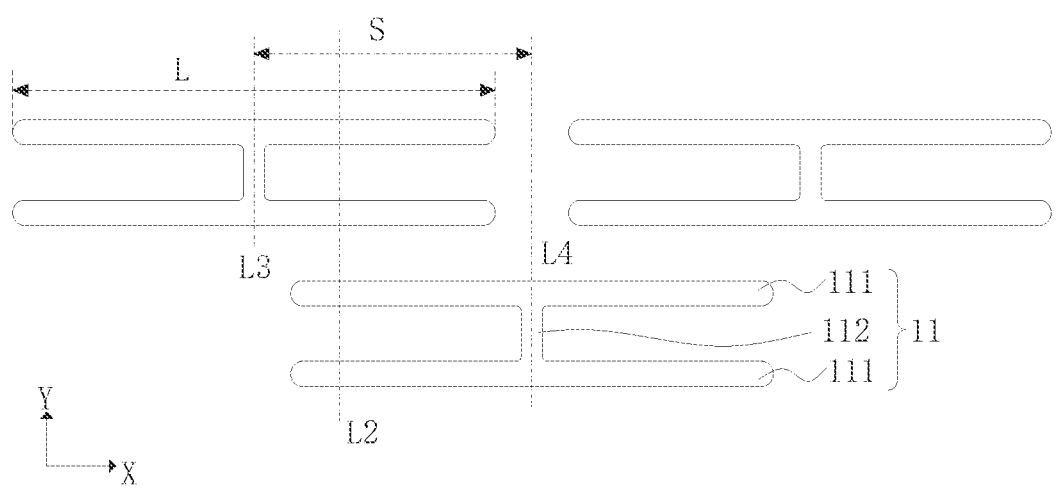
FIG. 4 is a schematic enlarged view illustrating first openings in FIG. 2.

Please refer to FIGS. 2 and 4. In one embodiment, a maximum length of each of the first openings 11 along the first direction X is L, and a spacing between center lines L3 and L4 of the second sub-openings 112 along the second direction in the first openings 11 of two adjacent columns is S, and $L/2<S<L$, so that the first openings 11 of two adjacent columns overlap in the first direction X. Accordingly, there is at least one straight line L2 extending along a direction the same as the second direction Y and passing through the first openings 11 of two adjacent columns. Through the overlapping design of the first openings 11 of two columns in the first direction X, an arrangement density of the first sub-openings 111 in the support plate 10 can be increased, and an opening area ratio of the first openings 11 can be increased. Therefore, an amount of elastic deformation of the support plate 10 is increased.

Figure 5:
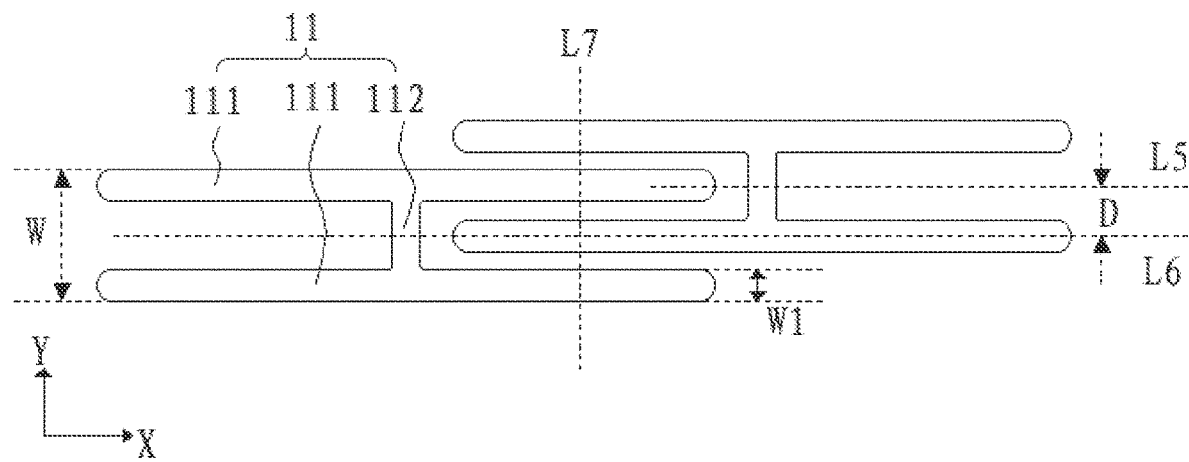
FIG. 5 is a schematic enlarged view illustrating the first openings in FIG. 3.

Furthermore, referring to FIGS. 3 and 5, in one embodiment, a maximum length of each of the first openings 11 along the second direction Y is W, and a maximum width of each of the first sub-openings 111 along the second direction Y is W1, and a spacing between center lines L5 and L6, along the first direction X, of the second sub-openings 112 of the first openings 11 in two adjacent rows is D, wherein $W1<D<(W-2W1)$. As a result, the first openings 11 of two adjacent rows overlap in the second direction Y. In detail, there is at least one straight line L7 extending along a direction the same as the second direction Y passing through the first openings 11 of two adjacent rows. Through the overlapping design of the first openings 11 of two adjacent rows in the second direction Y, an arrangement density of the second sub-openings 112 in the support plate 10 can be increased. Compared with the embodiment of FIG. 2, the present embodiment can further increase the opening area ratio of the first openings 11, thereby further increasing the amount of elastic deformation of the support plate 10, and ensure reliability in bending performance of the support plate 10.

Preferably, the spacing D between the center lines L5 and L6 is (W−W1)/2, so that the stress distribution of the support plate 10 is more uniform when it is bent.

A spacing between two adjacent first sub-openings 111 in the same row is less than a maximum length of each of the first sub-openings 111 along the first direction X.

A spacing between two adjacent first sub-openings 111 in the same column is less than the maximum width of each of the first sub-openings 111 along the second direction Y.

The maximum length W of the first opening 11 along the second direction Y can range from 0.8 mm to 0.9 mm.

The maximum length L of each of the first openings 11 along the first direction X can range from 4.00 mm to 4.20 mm. In the present embodiment, the maximum length L is the maximum length of each of the first sub-openings 111 in the first direction X.

The maximum width W1 of each of the first sub-openings 111 along the second direction Y can range from 0.18 mm to 0.22 mm.

A width of each of the second sub-openings 112 along the first direction X can range from 0.16 mm to 0.22 mm.

The spacing between two adjacent first sub-openings 111 in the same row can range from 0.45 mm to 0.55 mm.

The spacing between two adjacent first sub-openings 111 in the same column can range from 0.10 mm to 0.15 mm.

The first sub-openings 111 of the first opening 11 in any column are spaced from the second sub-opening 112 of the first opening 11 in an adjacent column by a distance of 0.14 mm to 0.18 mm along the first direction X.

In one embodiment, shapes of the first sub-openings 111 and the second sub-openings 112 comprise a strip shape, an oval shape, a plum blossom shape, a parallelogram, etc.

Referring to FIGS. 4 and 5, in the present embodiment, the shape of each of the first sub-openings 111 and the second sub-openings 112 is a strip shape.

Specifically, since the strip shape has corners, stress near the corners is more concentrated during bending, so the corners of the first sub-openings 111 and the corners of the second sub-openings 112 can be chamfered to be rounded corners to prevent stress concentration.

That is to say, the four corners of the first sub-opening 111 are rounded corners, and a radius of an arc of each of the rounded corners along the first direction X can range from 0.16 mm to 0.22 mm.

Furthermore, in the present embodiment, two ends of the first sub-opening 111 are of a semi-circular shape, and a radius of the semi-circular shape can be 0.16 mm to 0.22 mm.

Furthermore, a length of the first sub-opening 111 is greater than a length of the second sub-opening 112, which is beneficial to improve the extension performance of the support plate 10 when it is bent along the bending axis L1.

In one embodiment, referring to FIGS. 1 and 2, the bending region 101 and the rolling region 103 both comprise a middle area and edge areas arranged at two sides of the middle area and adjacent to free edges 1013. Each of the edge areas has multiple third openings 12 extending from the free edges 1013 to the middle area. For example, the bending region 101 comprises a middle area 1011 and edge areas 1012 arranged at two sides of the middle area 1011, and the rolling region 103 comprises a middle area 1031 and edge areas 1032 arranged at two sides of the middle area 1031. The free edges 1013 are edges of the support plate 10 perpendicular to the bending axis L1.

The third openings 12 form breaches in areas near the free edges 1013 of the bending region 101 and the rolling region 103, and the extension performance of the support plate 10 can be further improved. It can also reduce a compression stress on the display panel caused by two ends of the bending region 101 and the rolling region 103 during the bending or rolling process.

Specifically, the third openings 12 extend along the first direction X, the third openings 12 are defined in a direction perpendicular to the first direction X, any one of the third openings 12 is arranged in a same row with at least one of the first sub-opening holes 111.

Preferably, lengths of the third openings 12 in a same row in the first direction X are the same, so that when the support plate 10 is bent, the stress distribution in the areas close to the free edges 1013 on two sides of the support plate is more uniform.

In one embodiment, the third openings 12 can have a "U" shape.

Further, the third openings 12 comprise a plurality of third sub-openings 121 and a plurality of fourth sub-openings 122 with different lengths.

In the present embodiment, a length of each of the third sub-openings 121 is greater than a length of each of the fourth sub-openings 122.

The length of each of the fourth sub-openings 122 along the first direction X can be 1.45 mm to 1.55 mm.

Furthermore, referring to FIG. 3, the third sub-openings 121 and the fourth sub-openings 122 are alternately distributed in sequence. In a pattern design of the support plate 10, any one of the third openings 12 can be formed by the first sub-opening 111 intersecting the free edge 1013.

In one embodiment, as shown in FIGS. 2 to 5, in a same first opening 11, the second sub-opening 112 communicates with the two first sub-openings 111. That is to say, the first opening 11 forms an "I" or "H" shape.

Figure 6:
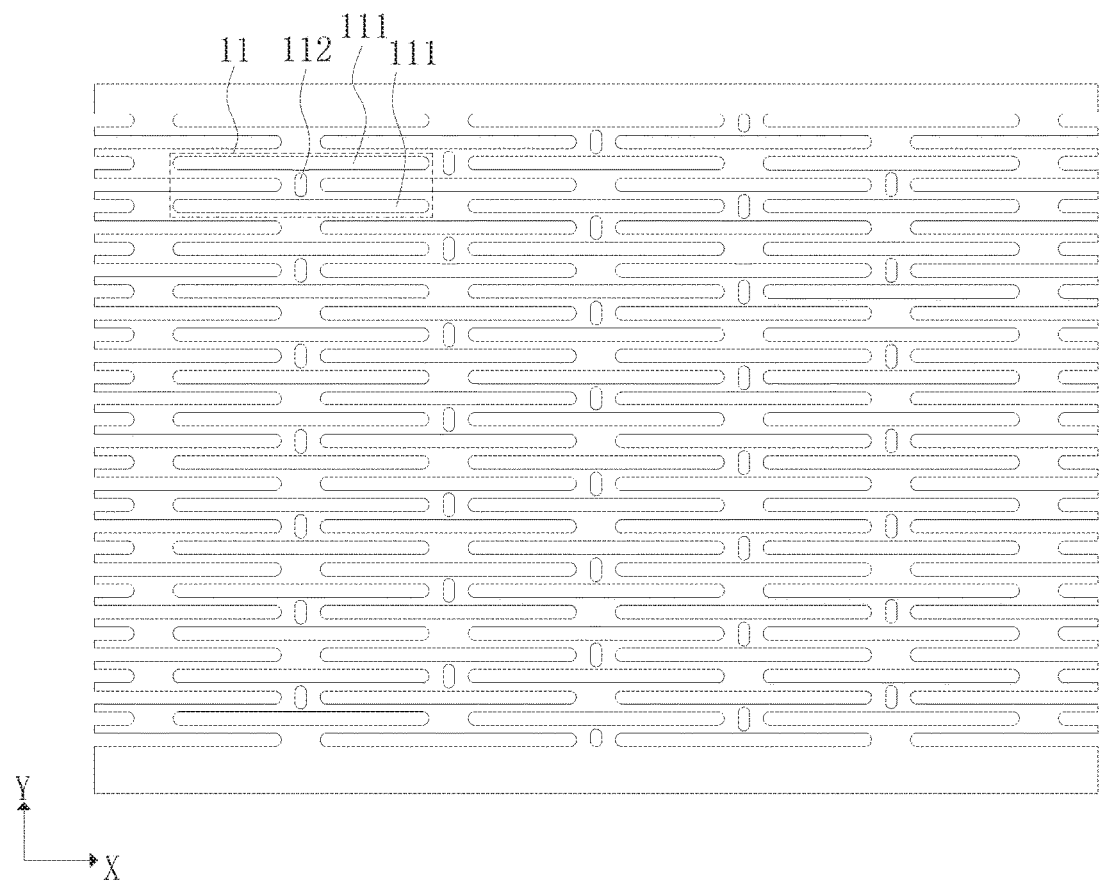
FIG. 6 is a schematic structural view illustrating the bending region of the support plate according to still another embodiment of the present invention.

In other embodiments, as shown in FIG. 6, in a same first opening 11, there is a gap between the second sub-opening 112 and each of the two first sub-openings 111.

Figure 7:
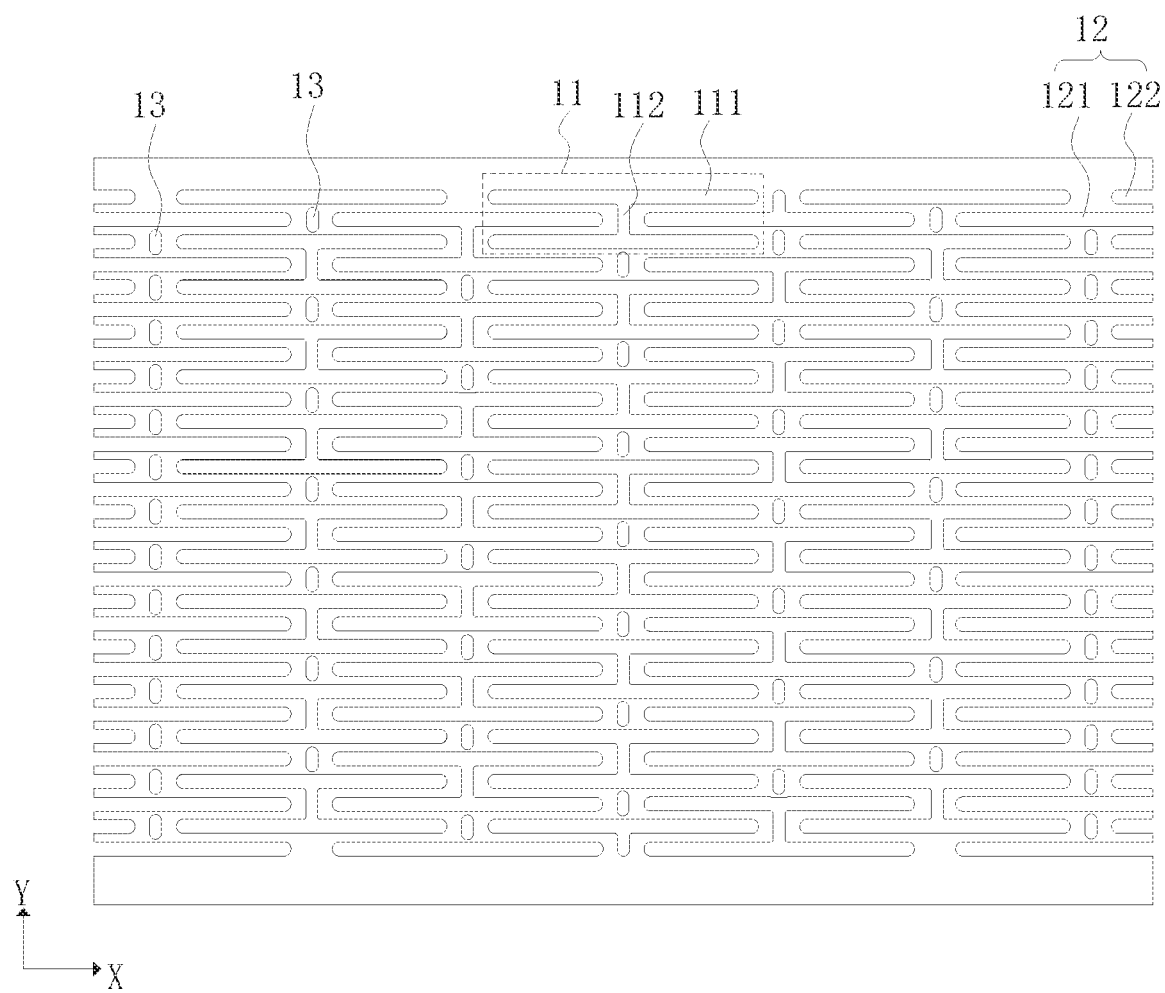
FIG. 7 is a schematic structural view illustrating the bending region of the support plate according to yet another embodiment of the present invention.
Figure 8:
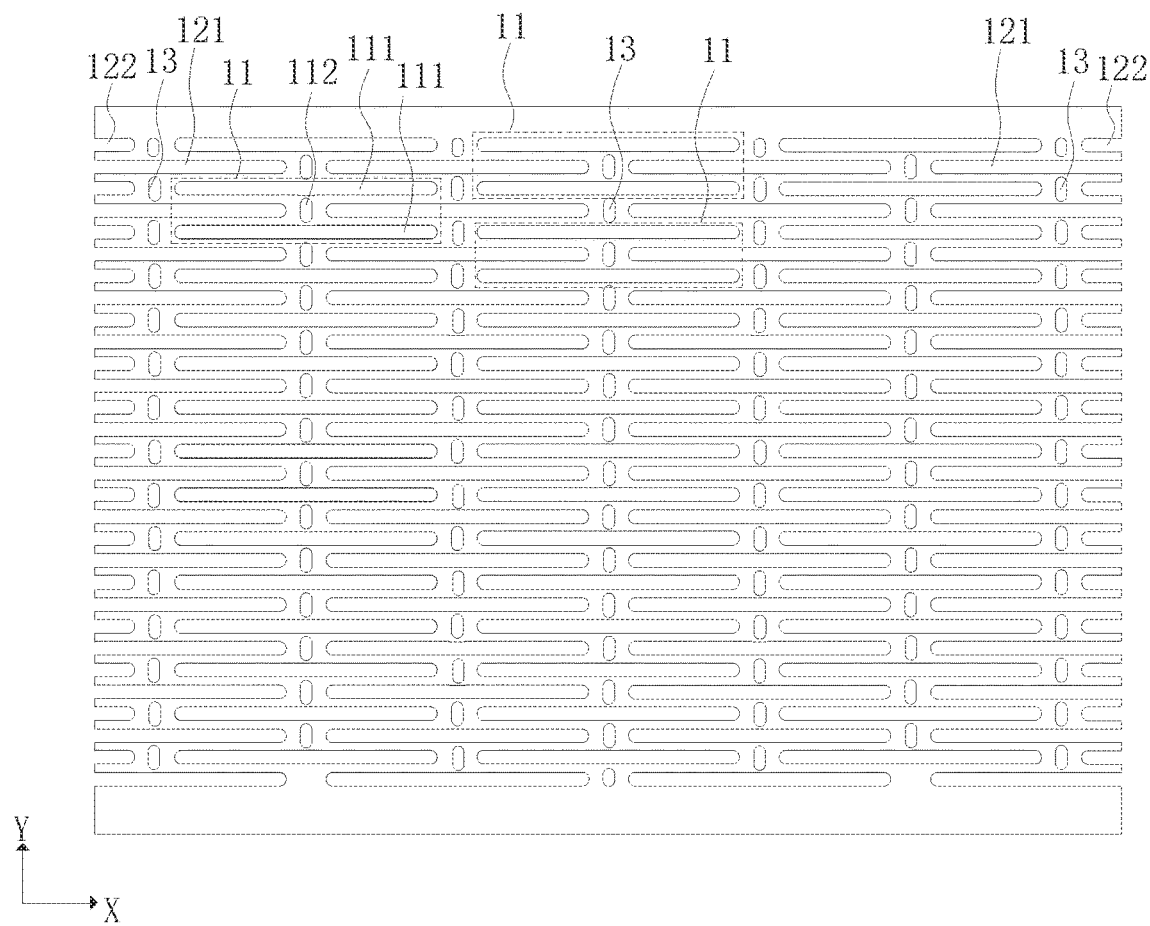
FIG. 8 is a schematic structural view illustrating the bending region of the support plate according to other embodiments of the present invention.

Further, referring to FIGS. 7 and 8, the support plate 10 further includes a plurality of second openings 13, the second openings 13 extend along the second direction Y, and the second openings 13 and the first openings 11 are alternately arranged along the second direction Y.

By having the second openings 13, the present invention increases the opening area ratio of the support plate 10, and the amount of elastic deformation of the support plate 10 can be improved.

Specifically, in one embodiment, a center line of any one of the second openings 13 along the second direction Y coincides with the center line of the second sub-opening 112 of the first opening 11 in the same column along the second direction Y.

The second openings 13 extend along the second direction Y, and there is a gap between the second opening 13 and each of the two adjacent first openings 11 to thereby increase stability of the support plate 10 in a longitudinal direction.

Furthermore, in one embodiment, one of the second openings 13 is also defined between two adjacent third sub-openings 121 arranged along the second direction Y to further increase the opening area ratio of the support plate 10. There is a gap between the second opening 13 and each of two adjacent third sub-openings 121 to increase the stability of the support plate 10 in the longitudinal direction.

Any second opening 13 in the middle areas 1011, 1031 is located in a gap between two adjacent first sub-openings 111 in the same row, and any second opening 13 in the edge area 1012 is located between the fourth sub-opening 122 and the first sub-opening 111 adjacent thereto in the same row.

Referring to FIG. 1, some embodiments of the present invention comprise one bending region and one rolling region as an example. The support plate 10 comprises a first non-bending region 102A, one bending region 101, and a second non-bending area 102B, one rolling region 103 which are arranged in sequence. A bending direction of the bending region 101 is opposite to a rolling direction of the rolling region 103.

Specifically, the bending region 101 can be folded inwardly into a wedge shape, which can satisfy a bending radius 1.5 mm.

The rolling region 103 can be slid and folded outward into a "U" shape, which can satisfy a bending radius of 2.5 mm to 3 mm.

Figure 9:
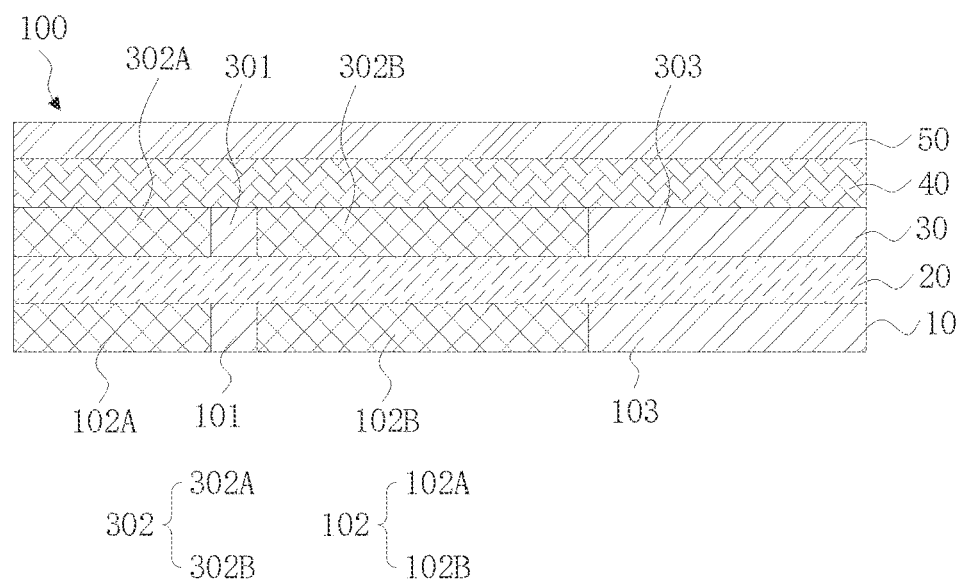
FIG. 9 is a schematic view illustrating a layer stacked structure of a foldable display screen according to one embodiment of the present invention.

Referring to FIG. 9, in one application of the above-mentioned support plate 10, the present invention also provides a foldable display screen 100. The foldable display screen 100 comprises the support plate 10 in any of the above-mentioned embodiments and a flexible display panel 30 arranged at one side of the support plate 10.

The flexible display panel 30 comprises a bending portion 301 corresponding to the bending region 101 of the support plate 10, a rolling portion 303 corresponding to the rolling region 103 of the support plate 10, and a plane portion 302 corresponding to the non-bending region 102 of the support plate 10. Further, the foldable display screen 100 further comprises a backplate 20, a polarizer 40, and a touch layer 50. The backplate 20 is disposed between the flexible display panel 30 and the support plate 10, the polarizer 40 is disposed on one side of the flexible display panel 30 away from the support plate 10, and the touch layer 50 is disposed on one side of the polarizer 40 away from the flexible display panel 30.

In one embodiment, a cover plate is disposed on one side of the touch layer 50 away from the flexible display panel 30, and the cover plate is attached to the touch layer 50 by means of a first adhesive layer.

The backplate 20 is attached to the support plate 10 by means of a second adhesive layer.

The first adhesive layer and the second adhesive layer comprise, but are not limited to, a pressure sensitive adhesive (PSA).

Further, in one embodiment, a thermoplastic polyurethane resin film is disposed between the backplate 20 and the support plate 10. Thermoplastic polyurethane resin has characteristics of high tension, high tensile force, toughness, and aging resistance.

An adhesive layer is disposed between the thermoplastic polyurethane resin film and the backplate 20, and between the thermoplastic polyurethane resin film and the support plate 10, for bonding them.

A position of a neutral layer of the foldable display screen 100 can be adjusted by adjusting a thickness of each adhesive layer, so that the flexible display panel 30 is located at film layers that are closer to the position of the neutral layer, thereby enhancing the bending performance of the foldable display screen 100.

Furthermore, in the present embodiment, the support plate 10 comprises one bending region 101 and one rolling region 103 as an example for description, but the present invention is not limited in this regard. In other embodiments, the support plate 10 can include more bending regions 101 and two rolling regions 103.

Specifically, the support plate 10 comprises the first non-bending region 102A, the bending region 101, the second non-bending region 102B, and the rolling region 103 that are arranged in sequence.

Correspondingly, the flexible display panel 30 comprises a first plane portion 302A, the bending portion 301, a second plane portion 302B, and the rolling portion 303 arranged in sequence.

Figure 10:
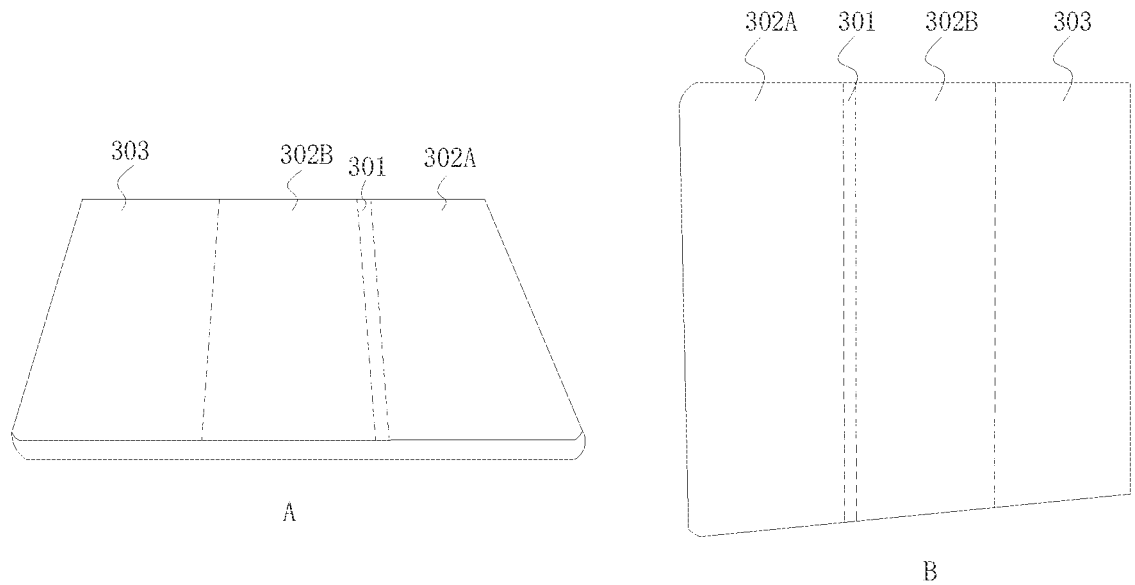
FIG. 10 is a schematic view illustrating the foldable display screen in a flat state according to one embodiment of the present invention.

Please refer to A and B in FIG. 10, A in FIG. 10 is a schematic front view of the foldable display screen 100, and B in FIG. 10 is a schematic back view of the foldable display screen 100.

In the flat state, the foldable display screen 100 comprises a front side and a back side opposite to each other.

In the flat state, display surfaces of all portions of the flexible display panel 30 are all located on the front, and the foldable display screen 100 has a largest display area, which can be used in a computer scenario.

Figure 11:
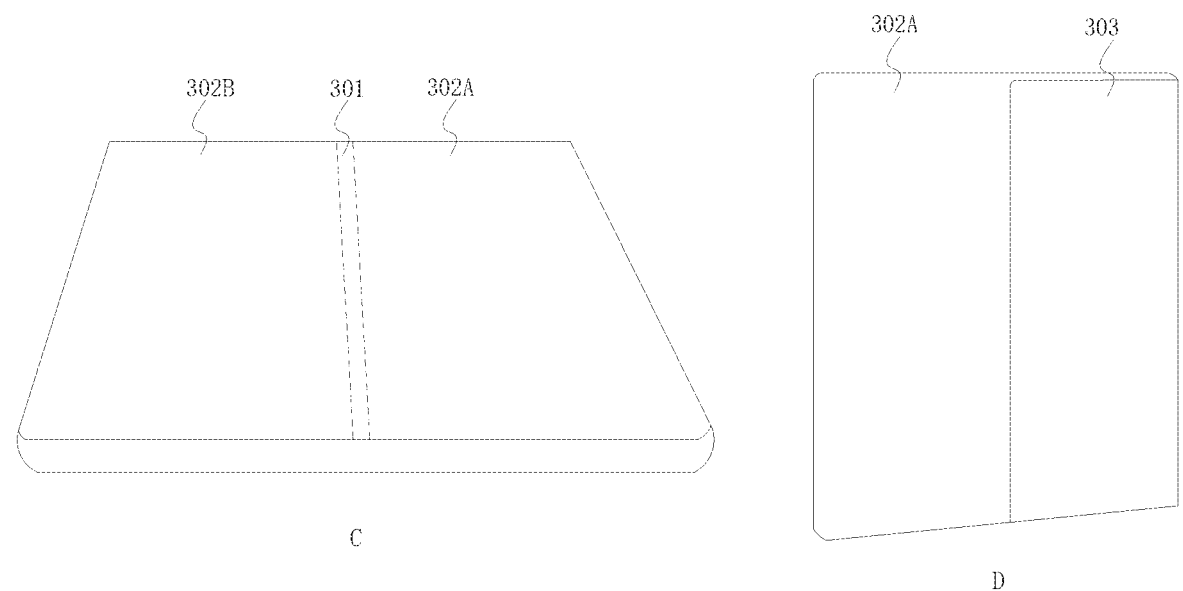
FIG. 11 is a schematic structural view of the foldable display screen after a rolling portion is slid and folded outward according to one embodiment of the present invention.

Please refer to FIG. 11. "C" in FIG. 11 is a schematic front view of the foldable display screen 100 after the rolling portion 303 of the foldable display screen 100 is slid and rolled to the back. "D" in FIG. 11 is a schematic back view of the foldable display screen 100 after the rolling portion 303 of the foldable display screen 100 is slid and rolled to the back. During a process from flat to folded, the rolling portion 303 is rolled while sliding. The rolling portion 303 is slid and folded outward to a back side (one side facing the second non-bending region 102B) of the second plane portion 302B. The display surface of the foldable display screen 100 corresponding to the rolling portion 303 is located on the back, and the display area of the foldable display screen 100 is reduced. At this time, the first plane portion 302A and the second plane part 302B together form the display surface, which can be used in a pad scenario.

Generally, a bending radius of the bending portion 301 should not be too large, so the bending portion 301 occupies a small portion of the display surfaces. Therefore, the display surfaces of the foldable display screen 100 in the present invention are mainly composed of three parts, namely, the rolling portion 303, the second plane portion 302B, and the first plane portion 302A. Folding of the foldable display screen 100 of the present invention can comprise folding twice in different forms. In order to make the above three parts overlap and not occupy too much space after folding twice, it is preferable that the rolling portion 303, the second plane portion 302B, and the first plane portion 302A are substantially equal in length and width.

Figure 12:
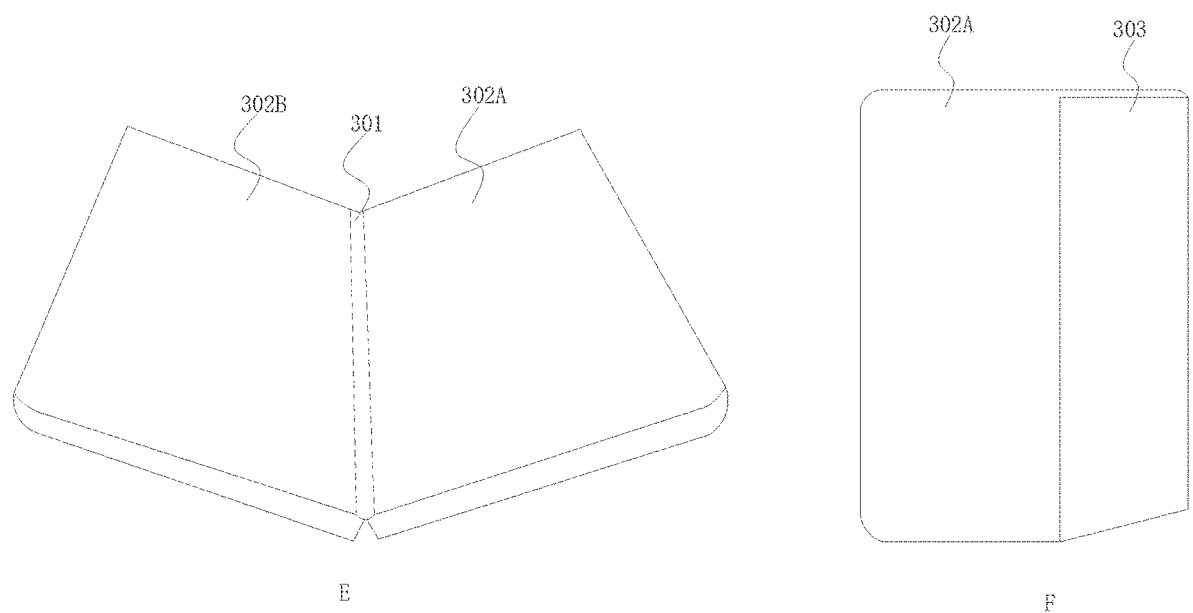
FIG. 12 is a schematic structural view illustrating the foldable display screen after a bending portion is folded inward according to one embodiment of the present invention.
Figure 13:
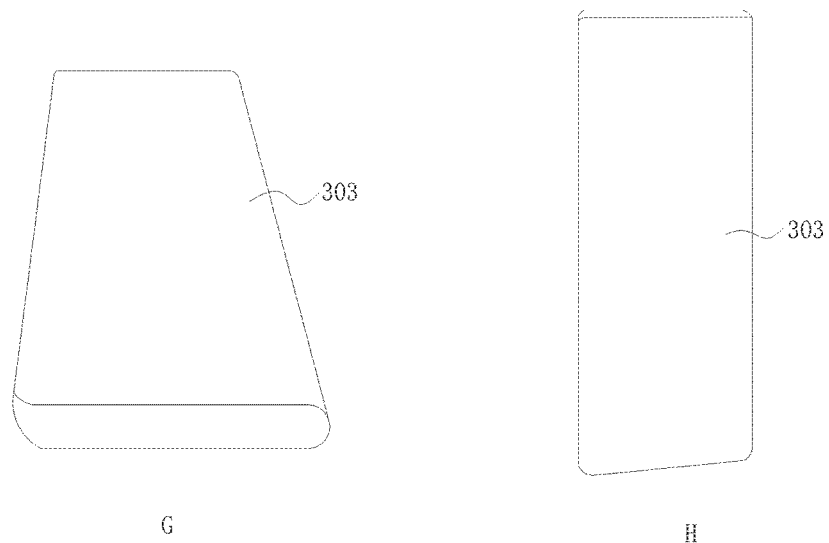
FIG. 13 is a schematic structural view illustrating the foldable display screen after the bending portion is folded inward.

Referring to FIGS. 12 and 13, E in FIG. 12 is a schematic front view of the foldable display screen 100 when the bending portion 301 of the foldable display screen 100 is folded inward, and F in FIG. 12 is a schematic back view of the foldable display screen 100 when the bending portion 301 of the foldable display screen 100 is folded inward. G and H in FIG. 13 are both schematic back views of the foldable display screen 100 after the bending portion 301 is completely folded. The bending portion 301 drives the first plane portion 302A to bend to a front side (one side away from the second non-bending region 102B) of the second plane portion 302B during an inward folding process. A portion of the foldable display screen 100 corresponding to the first plane portion 302A is folded to the front of the foldable display screen 100 to further reduce the display area of the foldable display screen 100. At this time, the display surface corresponding to the first plane portion 302A and the display surface corresponding to the second plane portion 302B face each other and cannot display images. Therefore, only a portion of the foldable display screen 100 corresponding to the rolling portion 303 on the back is the display surface, which can be used in a mobile phone scenario.

In the present invention, the support plate 10 is designed to have a structure with the bending region and the rolling region at the same time, and the first openings 11 arranged in an array are defined in the bending region and the rolling region, which can support the flexible display panel, improve flatness and evenness of the flexible display panel, and can also make the support plate in the bending region have good extension performance and ability to recover from deformations, thus reducing wrinkles and creases generated by a bending portion of conventional flexible display panels. In addition, the first openings 11 comprise the first sub-openings 111 and the second sub-openings 112 extending along different directions, which can simultaneously facilitate the release of the bending stress and the release of the tensile stress in the bending region 101 and the rolling region 103, so that the support plate 10 has good extension performance and ability to recover from deformations in the two regions.

It should be noted that for those of ordinary skill in the art, equivalent substitutions or changes can be made according to the technical solution and inventive concept of the present application, and such changes or substitutions should fall within the protection scope of the appended claims of the present application.

What is claimed is:

1. A support plate for supporting a flexible display panel, comprising:
   a bending region configured to bend along a bending axis;
   a rolling region arranged close to an edge of the support plate, the rolling region configured to slide along a sliding direction and roll, the sliding direction of the rolling region perpendicular to the bending axis of the bending region; and
   a plurality of non-bending regions arranged at two opposite sides of the bending region and between the bending region and the rolling region;
   wherein the bending region and the rolling region both comprise a plurality of first openings arranged in an array,
   each of the first openings comprises two first sub-openings extending along a first direction and arranged in a direction perpendicular to the first direction, and a second sub-opening located between the two first sub-openings and extending along a second direction; and the second direction is different from the first direction.

2. The support plate according to claim 1, wherein the first openings in each pair of adjacent columns or in each pair of adjacent rows are staggered with respect to each other.

3. The support plate according to claim 2, wherein the first direction and the second direction are perpendicular to each other, and the two first sub-openings of each of the first openings are arranged parallel and flush with each other.

4. The support plate according to claim 3, wherein a maximum length of each of the first openings along the first direction is L, a spacing between center lines, along the second direction, of the second sub-openings of the first openings in two adjacent columns is S, and $L/2 < S < L$.

5. The support plate according to claim 4, wherein a maximum length of each of the first openings along the second direction is W, a maximum width of each of the first sub-openings along the second direction is W1, a spacing between center lines, along the first direction, of the second sub-openings of the first openings in two adjacent rows is D, and $W1 < D < (W-2W1)$, wherein the support plate further comprises a plurality of second openings, the second openings extend along the second direction, and the second openings and the first openings are alternately defined in the second direction.

6. The support plate according to claim 5, wherein a center line, along the second direction, of each of the second openings coincides with a center line, along the second direction, of each of the second sub-openings of the corresponding first openings in the same column.

7. The support plate according to claim 1, wherein the first sub-openings in any two adjacent rows are staggered with respect to each other, the first sub-openings in odd-numbered rows are aligned with each other, and the first sub-openings in even-numbered rows are aligned with each other.

8. The support plate according to claim 1, wherein the second sub-openings of any two columns among the second sub-openings of four consecutive columns are staggered with respect to each other.

9. The support plate according to claim 1, wherein in a same first opening, the second sub-opening communicates with the two first sub-openings.

10. The support plate according to claim 1, wherein in a same first opening, a gap is present between the second sub-opening and each of the two first sub-openings.

11. The support plate according to claim 1, wherein a length of each of the first sub-openings is greater than a length of each of the second sub-openings.

12. The support plate according to claim 1, wherein the bending region and the rolling region both comprise a middle area and edge areas arranged at two sides of the middle area and adjacent to free edges, and a plurality of third openings extending from the free edges toward the middle area are defined in the edge areas.

13. The support plate according to claim 12, wherein the third openings extend along the first direction, the third openings are arranged in the direction perpendicular to the first direction, and each of the third openings is arranged in a same row with at least one of the first sub-openings.

14. The support plate according to claim 13, wherein the third openings comprise a plurality of third sub-openings and a plurality of fourth sub-openings with different lengths, and the third sub-openings and the fourth sub-openings are alternately defined, wherein each of the third openings has a U shape.

15. The support plate according to claim 1, wherein an extending direction of each of the first sub-openings is the same as a direction of the bending axis of each of the bending region, and an extending direction of each of the second sub-openings is the same as the sliding direction of each of the rolling region.

16. The support plate according to claim 1, wherein the support plate comprises a first non-bending region, one bending region, a second non-bending region, and one rolling region that are sequentially arranged, and a bending direction of the bending region is opposite to a rolling direction of the rolling region.

17. A foldable display screen, comprising a support plate and a flexible display panel arranged on one side of the support plate, the support plate comprising:
   a bending region configured to bend along a bending axis;
   a rolling region close to an edge of the support plate, wherein the rolling region is configured to slide along a sliding direction and roll, the sliding direction of the rolling region perpendicular to the bending axis of the bending region; and
   a plurality of non-bending regions arranged at two opposite sides of the bending region and between the bending region and the rolling region;
   wherein the bending region and the rolling region both comprise a plurality of first openings arranged in an array; each of the first openings comprises two first sub-openings extending along a first direction and arranged in a direction perpendicular to the first direction, and a second sub-opening located between the two first sub-openings and extending along a second direction; and the second direction is different from the first direction; and the flexible display panel comprises a bending portion arranged corresponding to the bending region of the support plate, a rolling portion arranged corresponding to the rolling region of the support plate, and a plurality of plane portions arranged corresponding to the non-bending regions of the support plate.

18. The foldable display screen according to claim 17, wherein the foldable display screen further comprises:
- a backplate arranged between the flexible display panel and the support plate;
- a polarizer arranged on one side of the flexible display panel away from the support plate; and
- a touch layer arranged on one side of the polarizer away from the flexible display panel.

* * * * *